(12) United States Patent
Otremba

(10) Patent No.: US 7,880,288 B2
(45) Date of Patent: Feb. 1, 2011

(54) SEMICONDUCTOR MODULE WITH SEMICONDUCTOR CHIPS AND METHOD FOR PRODUCING IT

(75) Inventor: Ralf Otremba, Kaufbeuren (DE)

(73) Assignee: Infineon Technologies AG (DE)

( * ) Notice: Subject to any disclaimer, the term of this patent is extended or adjusted under 35 U.S.C. 154(b) by 304 days.

(21) Appl. No.: 11/692,020

(22) Filed: Mar. 27, 2007

(65) Prior Publication Data

US 2008/0224300 A1    Sep. 18, 2008

(30) Foreign Application Priority Data

Mar. 12, 2007    (DE) ................. 10 2007 012 154

(51) Int. Cl.
*H01L 23/48* (2006.01)
(52) U.S. Cl. ...................... 257/693; 257/578
(58) Field of Classification Search ............. 257/684, 257/686, 578, 584, 693
See application file for complete search history.

(56) References Cited

U.S. PATENT DOCUMENTS

| | | | |
|---|---|---|---|
| 5,532,512 A * | 7/1996 | Fillion et al. ............. | 257/686 |
| 6,031,279 A | 2/2000 | Lenz | |
| 6,677,669 B2 | 1/2004 | Standing | |
| 6,841,869 B1 * | 1/2005 | Triantafyllou et al. ...... | 257/723 |
| 7,071,550 B2 | 7/2006 | Sato | |
| 7,504,720 B2 * | 3/2009 | Nakatsu et al. ............ | 257/712 |
| 2005/0023658 A1 * | 2/2005 | Tabira et al. ............. | 257/678 |
| 2005/0206010 A1 | 9/2005 | Noquil et al. | |
| 2006/0097380 A1 * | 5/2006 | Sato ...................... | 257/706 |
| 2006/0145319 A1 | 7/2006 | Sun et al. | |

| | | |
|---|---|---|
| 2007/0040260 A1 | 2/2007 | Otremba |

FOREIGN PATENT DOCUMENTS

| | | |
|---|---|---|
| DE | 19635582 | 2/1998 |
| DE | 10301091 | 7/2004 |
| DE | 102004037085 | 3/2005 |
| DE | 102005007373 | 8/2006 |

(Continued)

OTHER PUBLICATIONS

First Examination Report of DE102007012154.9-33, dated Oct. 22, 2007.

(Continued)

*Primary Examiner*—Steven Loke
*Assistant Examiner*—Kimberly M Thomas
(74) *Attorney, Agent, or Firm*—Banner & Witcoff, Ltd.

(57) ABSTRACT

A semiconductor module has at least two semiconductor chips (4, 5) with at least one first and one second electrode (12, 13) on their first sides. Each semiconductor chip (4, 5) has a third electrode (14) on its second side (16). A chip arrangement within the semiconductor module (1) is provided such that the electrodes (12, 13) on the first sides of the semiconductor chips (4, 5) are oriented toward a second side of the semiconductor module (1) and the third electrodes (14) on the second sides (16) of the semiconductor chips (4, 5) are oriented toward a first side of the semiconductor module (1). For this purpose, external terminals (19, 20) on the second side of the semiconductor module (1) are directly coupled to the electrodes (12, 13) of the first sides and connecting elements (22) electrically couple the third electrodes (14) to corresponding external terminals (21).

15 Claims, 8 Drawing Sheets

FOREIGN PATENT DOCUMENTS

| | | |
|---|---|---|
| DE | 102005039478 | 2/2007 |
| WO | 2006087065 | 8/2006 |

OTHER PUBLICATIONS

Sawle A., et al., "Direct(TM)"—A Proprietary New Source Mounted Power Package for Board Mounted Power, International Rectifier, 5 pages, undated (presumed published prior to filing of present application).

Power MOSFET for Switching Power Supply, Toshiba, 1 page undated (presumed published prior to filing of present application).

* cited by examiner

SEMICONDUCTOR MODULE WITH SEMICONDUCTOR CHIPS AND METHOD FOR PRODUCING IT

RELATED APPLICATION

This application claims priority from German Patent Application No. DE 10 2007 012 154.9, which was filed on Mar. 12, 2007, and is incorporated herein by reference in its entirety.

BACKGROUND

The invention relates to a semiconductor module with semiconductor chips and to a method for producing it.

TECHNICAL FIELD

For this purpose, the semiconductor module has at least two semiconductor chips which have on their topsides at least one first and one second electrode and have on their backs a third electrode which covers almost the entire back.

Such semiconductor chips are fixed with their electrodes of the back on semiconductor chip islands of lead material in semiconductor modules whereas the electrodes of the topside are connected in cost-intensive and technically complex manner to external terminals via correspondingly many and in some cases also different connecting elements within the semiconductor module.

It is also possible to stack such semiconductor chips in which arrangement the stacked semiconductor chip is fixed with its third electrode on its back to the first electrode of the topside of a base semiconductor chip of the stack whereas the second electrode of the topside of the base semiconductor chip can be accessed from an external terminal via a connecting element.

Usually, however, the two semiconductor chips are fixed with their electrodes of the backs next to one another to corresponding electrically separated leads and arrangements are also known in which intermeshing contact bridges or clips enable the electrodes of the topside to be connected to corresponding external terminals. In the known semiconductor modules, the external terminals can be arranged as surface-mountable contact faces on the underside of the semiconductor modules or they protrude laterally from a package or can be contacted additionally from the peripheral sides of the semiconductor modules. In this arrangement, the third electrodes on the backs of the semiconductor chips are oriented toward the underside of the semiconductor module and fixed on external terminals and the electrodes of the topside are oriented toward the topside of the semiconductor module.

Instead of leads for receiving, fixing and electrically connecting the third electrodes, substrates clad with conductive materials can also be used wherein through contacts through the substrates to corresponding external contact faces on the underside of the semiconductor modules enable the third electrodes of the semiconductor chips to be accessed and corresponding contact bridges connect the first and second electrodes of the topside to the substrate. In these cases, too, the third electrodes are oriented toward the underside of the semiconductor module and the electrodes of the topside of the semiconductor chip point to the topside of the semiconductor module.

Frequently, MOSFET semiconductor chips are also combined with electronic control chips to form semiconductor modules, wherein the third electrode of the semiconductor chips is oriented toward the underside of the semiconductor module and the control chip is arranged additionally on the underside of the semiconductor module between solder balls attached as external terminals. In addition, semiconductor bridges and full-bridge circuits for on-board motor vehicle networks are known as semiconductor modules which are also based on the fact that the semiconductor chips are oriented with their third electrodes on their backs toward the underside of the semiconductor module. For this purpose, elaborate constructions for connecting the first and second electrodes arranged on the topside of the semiconductor chips must be accepted.

SUMMARY

According to an embodiment, a semiconductor module may have at least two semiconductor chips with at least one first and one second electrode on their first sides. Furthermore, the semiconductor chips in each case have a third electrode on their second sides. A chip arrangement within the semiconductor module is provided in such a manner that the electrodes on the first sides of the semiconductor chips are oriented toward a second side of the semiconductor module and the third electrodes on the second sides of the semiconductor chips are oriented toward a first side of the semiconductor module. External terminals on the second side of the semiconductor module may be directly coupled to the electrodes of the first sides and connecting elements may electrically couple the third electrodes to corresponding external terminals.

BRIEF DESCRIPTION OF THE DRAWINGS

The invention will now be explained in greater detail with reference to the attached figures.

DETAILED DESCRIPTION

Figure 1:
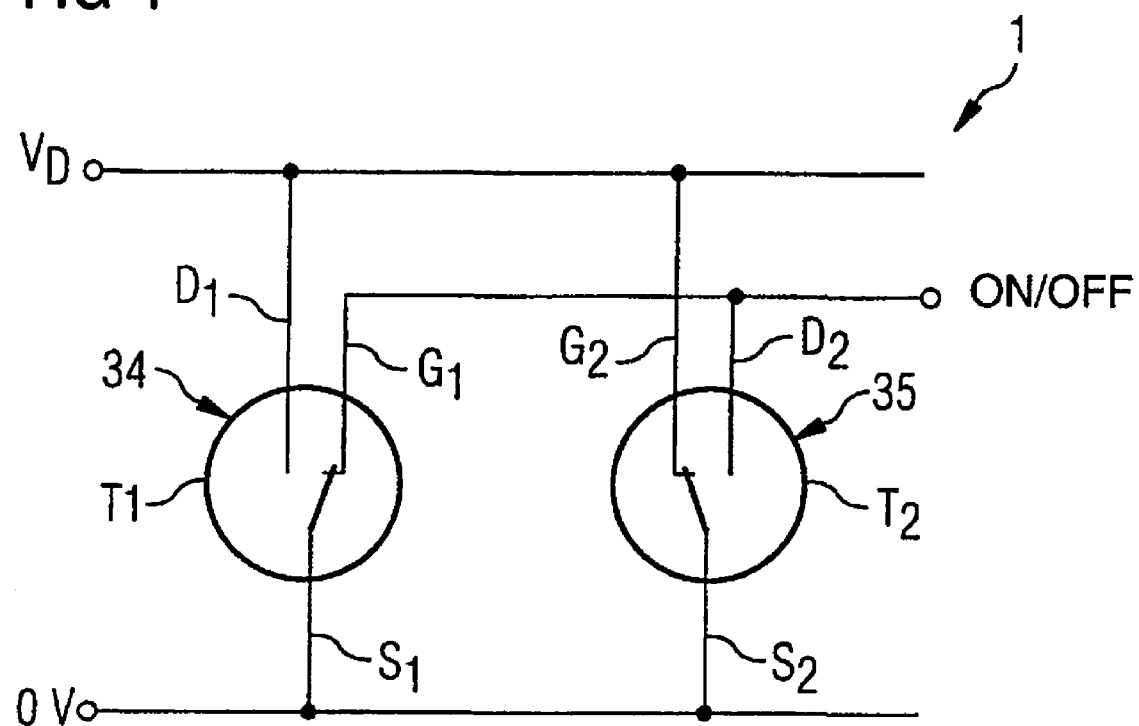
FIG. 1 shows a diagrammatic circuit of a semiconductor module of an embodiment.

FIG. 1 shows a diagrammatic circuit of a semiconductor module 1 of an embodiment. In this assembly variant according to an embodiment, a circuit arrangement with cross-connected gate-drain connections of two power MOSFETs on the secondary side is implemented wherein the chip-rear potentials can be rewired via contact clips with adhesive, soft or diffusion solder connection. According to an embodiment, the circuit has two n-channel power transistors $T_1$ and $T_2$ of the MOSFET type which are cross-connected with one another for an AC/DC converter or a DC/DC converter. In this cross-connection, the gate electrode $G_1$ of the first transistor $T_1$ is electrically connected to the drain electrode $D_2$ of the second transistor $T_2$. Whereas the two source electrodes $S_1$ of the first transistor 34 and $S_2$ of the second transistor 35 are jointly connected to a 0 V potential, the drain electrode $D_1$ is connected to the supply potential $V_D$ and electrically connected to the gate electrode $G_2$ of the second transistor 35. This cross-connected circuit arrangement is then implemented with the aid of the basic concept according to an embodiment in a multi-chip module (MCM) for "current and voltage supply" application by integrating corresponding electronic components, simplifying the production options.

By means of the multi flip chip assembly proposed according to an embodiment, the two power components, namely the transistors $T_1$ and $T_2$, are assembly flipped in one component. This provides for an increase in the integration whilst at the same time improving the cost/benefit ratio of the connection technology since now only a single power electrode as third electrode on the chip back has to be rewired in each case by means of a connecting element of bonding wires or contact clips. According to an embodiment, in this arrangement, the flip chip assembly is used, for example, via copper pillars as flip chip contacts with diffusion solder for the power transistors in the multi-chip module by utilizing different contact elements such as bonding wires or contact clips for connecting the different potentials at the back. This results in a semiconductor module 1 as shown in FIGS. 2 and 3.

Figure 2:
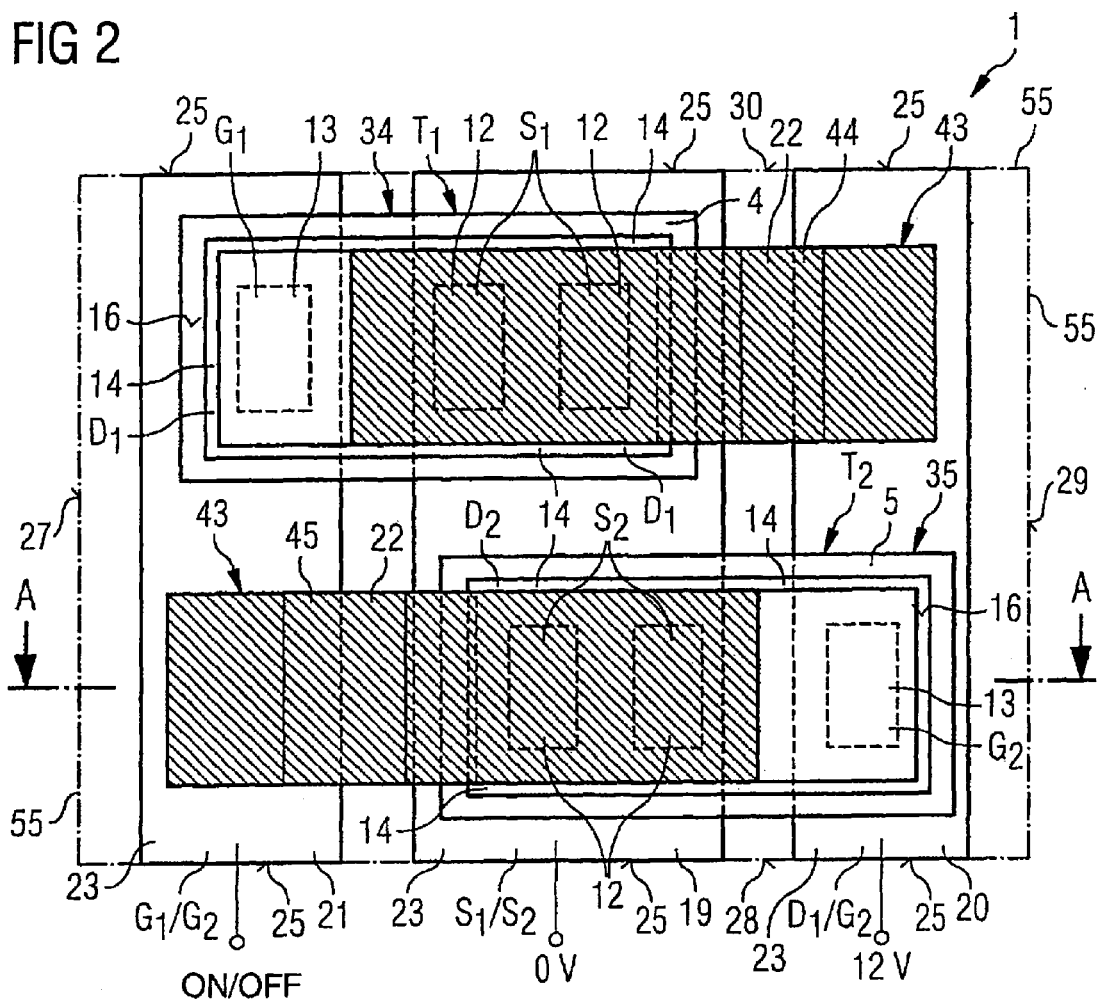
FIG. 2 shows a diagrammatic top view of a semiconductor module according to FIG. 1.
Figure 3:
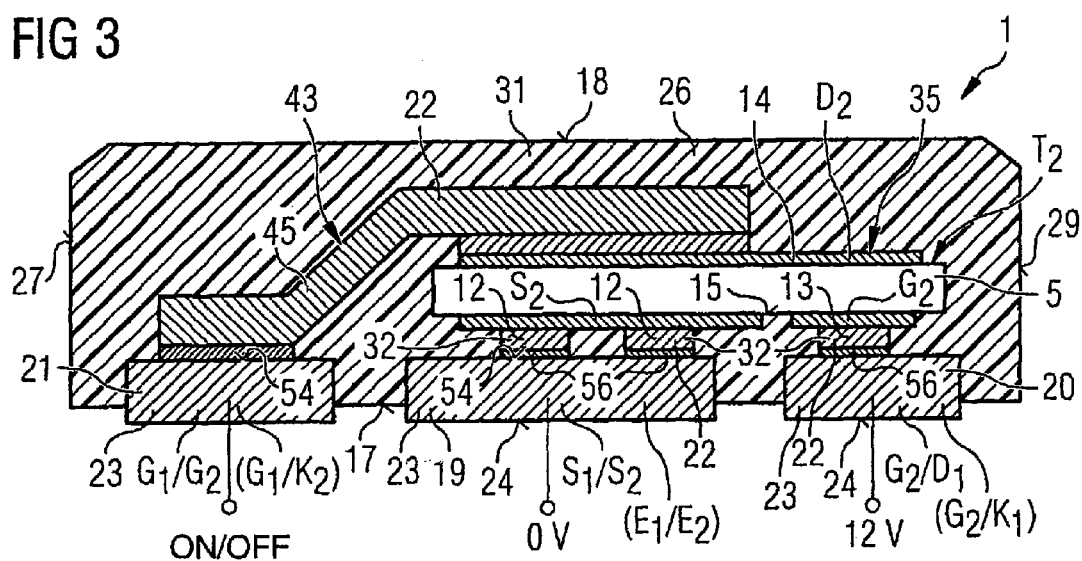
FIG. 3 shows a diagrammatic cross section through the semiconductor module according to FIG. 1.

FIG. 2 shows a diagrammatic top view of an embodiment of a semiconductor module 1 according to FIG. 1. This semiconductor module 1 has at least two semiconductor chips 4 and 5 with at least one first and one second electrode 12 and 13 on their first sides which are the topsides 15 in the present embodiment. Furthermore, the semiconductor chips 4 and 5 in each case have a third electrode 14 on their second sides which are the backs 16 opposite the topsides 15 in the present embodiment. A chip arrangement within the semiconductor module 1 is provided in such a manner that the electrodes 12 and 13 on the topsides of the semiconductor chips 4 and 5 are oriented toward a second side of the semiconductor module 1, which is the underside 17 in the present embodiment, and the third electrodes 14 on the backs 16 of the semiconductor chips 4 and 5 are oriented toward a first side of the semiconductor module. For this purpose, external terminals 19 and 20 on the underside of the semiconductor module are directly coupled to the electrodes 12 and 13 of the topsides and connecting elements 22 electrically couple the third electrodes 14 to corresponding external terminals 21.

To illustrate this, the plastic package compound has been omitted in FIG. 2 and dot-dashed lines 55 only mark the peripheral sides 27, 28, 29 and 30 of the semiconductor module 1. The semiconductor module 1 has on its underside the external terminals 19 for 0 V, 20 for 12 V and 21 as ON/OFF terminal. To implement the cross-connected circuit arrangement shown in FIG. 1, the first transistor $T_1$ is constructed as first semiconductor chip 4 and mounted with its source electrodes $S_1$ directly on the external terminal 19, constructed as strip-shaped external contact block 23, in flip chip technology. The gate electrode $G_1$, or second electrode 13, respectively, which is also equipped with a flip chip contact on the first side of the first semiconductor chip 4, is fixed on the external ON/OFF terminal of the semiconductor module 1 since it is electrically coupled to the drain electrode $D_2$ of the second semiconductor chip 5 according to the circuit arrangement of FIG. 1. In this embodiment, flip chip contacts of electrodes 12, 13 of the topsides 15 of different semiconductor chips 4, 5 are accordingly arranged on an external contact block 23 so that the electrodes 12, 13 are electrically connected to one another.

According to an embodiment, the drain electrode $D_1$, arranged on the back 16 of the first semiconductor chip 4, is electrically connected to the external 12-V terminal on the underside of the semiconductor module 1 via a first connection bridge 44. In this arrangement, the first connection bridge 44 covers the third electrode 14 on the back 16 of the first semiconductor chip 4 almost completely.

According to an embodiment, the second semiconductor chip 5 is also mounted with its source electrodes $S_2$ as first electrodes 12 on the external 0 V terminal in flip chip technology whereas, to implement the cross-connected circuit arrangement of FIG. 1, the second electrode 13 of the semiconductor chip 5, as gate electrode $G_2$, is connected to the external 12-V terminal 20. The third electrode 14 arranged on the back 16 of the second semiconductor chip 5 is electrically connected via a second bonding bridge 45 to the external ON/OFF terminal on the underside of the semiconductor module 1 so that the second drain electrode $D_2$ is interconnected with the first gate electrode $G_1$ on the external terminal 21 in the form of a strip-shaped external contact block 23. This arrangement thus only requires two connecting elements 22 which are here implemented in the form of connecting bridges 44 and 45.

According to an embodiment, instead of the connecting bridges 44 and 45, however, bonding wires or bonding strips can also be used for electrically connecting the third electrodes 14 of the backs 16 of the semiconductor chips 4 and 5 to the corresponding external terminals 21 and 20, respectively. In this embodiment, the external terminals can be accessed not only from the underside of the semiconductor module 1 but the strip-shaped external contact blocks 23 are also accessible from the peripheral sides 28 and 30 in this embodiment since they also have external contact faces 25 on the peripheral sides 28 and 30. It is also possible to allow the strip-shaped external contact blocks 23 to protrude from the peripheral sides 28 and 30 in the form of leads of a leadframe and to construct them as connecting tabs on one peripheral side or on both peripheral sides.

FIG. 3 shows a diagrammatic cross section through an embodiment of the semiconductor module 1 according to FIG. 1 along the section line A-A shown in FIG. 2. This cross section shows that the strip-shaped external contact blocks 23 shown in FIG. 2 have surface-mountable external contact faces 24 on the underside 17 of the semiconductor module 1 and are freely accessible and are fixed in a semiconductor module package 26. In the present embodiment, this semiconductor module package 26 has a plastic package compound 31 in which the external contact blocks 23 are embedded partially and the semiconductor chips 5, of which the semiconductor chip 5 of the second transistor $T_2$ can be seen in the present cross section, are embedded completely with the connecting elements 22.

It is characterizing of this embodiment that contact pillars 32, which facilitate flip chip assembly of the semiconductor chip 5 on the external contact blocks 23, are arranged on the first electrode 12 and the second electrode 13 of the first side 15 of the semiconductor chip 5. These contact pillars 32 have a copper alloy and are electrically and mechanically connected to the external contact blocks 23 via solder layers 56. These solder layers 56 can have diffusion solder. Such diffusion solder has the advantage that it forms intermetallic faces. These intermetallic faces have a higher melting temperature than the diffusion solder temperature. This enables the connecting bridge 43 shown in FIG. 3 to be applied subsequently at soldering temperatures for soft solders or at curing temperatures for conductive adhesives without the flip chip arrangement of the semiconductor chip 5 already existing on the external terminals 19 and 20 being damaged.

According to an embodiment, the electrodes 12 and 13 of the first side 15 of the semiconductor chip 5 are fixed on mutually separate external contact blocks 23. The third electrode 14 on the back 16 of the semiconductor chip 5 is electrically connected via a connecting element 43 to a contact terminal face 54 of a further external terminal 21, which is also formed from an external contact block 23, in the present embodiment. Instead of a connecting bridge 43, bonding strips or a multiplicity of bonding wires can also provide the connection between the third electrode 14, which represents the drain electrode $D_2$ in this case, and the external terminal 21.

According to an embodiment, on the external terminal 21, it is not only the drain electrode $D_2$ of the second semiconductor chip 5 which is located there but, at the same time, also the gate electrode $G_1$ of the first semiconductor chip 4 shown in FIG. 2. Together, these form an ON/OFF terminal of the semiconductor module. An external terminal 19 arranged in the center of the underside 17 of the semiconductor module 1 connects to both source electrodes $S_1$ and $S_2$ and is at a ground potential of 0 V for this circuit. Finally, the external terminal 20 connects the gate electrode $G_2$ of the second semiconductor chip 5 to the drain electrode $D_1$ of the first semiconductor chip.

According to an embodiment, instead of the semiconductor chip 5 shown here as power semiconductor chip of the MOSFET type, a power semiconductor chip of the IGBT type can also be provided. In this case, the first electrode 12 is an emitter electrode E and the second electrode 13 of the first side 15 of the semiconductor chip 5 is an insulated gate electrode G whilst the drain electrode is then constructed as collector electrode K. Furthermore, the external contact blocks 23 of the semiconductor module 1 can represent lead pieces of a leadframe which is used in the production of the semiconductor modules.

Another embodiment in form of a method for producing a number of semiconductor modules 1 according to FIGS. 1 to 3 with semiconductor chips 4 and 5 has the following method steps. According to an embodiment, firstly, a leadframe with a number of semiconductor module positions is provided, external terminals 19, 20 and 21 being provided in the semiconductor module positions. These semiconductor module positions are kept in place by the leadframe, the external terminals 19, 20 and 21 being arranged adjacently to one another in such a manner that external terminals 19 and 20 arranged electrically separate from one another can be contacted with first and second electrodes 12 and 13, respectively, on a first side 15 of a semiconductor chip 4 and 5, respectively, in flip chip arrangement.

For this purpose, according to an embodiment, at least two semiconductor chips 4 and 5 are mounted in a semiconductor module position in flip chip arrangement on the external terminals 19, 20 and 21. After the first and second semiconductor chip 4 and 5, respectively, has been mounted, connecting elements 22 are applied between the external terminal 21 for $D_2$ and the external terminal 20 for $D_1$ and a third electrode 14 on the back 16 of the semiconductor chips 4 and 5 having a flip chip arrangement. Following this, the semiconductor chips 4 and 5, the connecting elements 22 and partially the external terminals 19, 20 and 21 are embedded in the semiconductor chip positions in a plastic package compound 31, leaving external contact faces 24 of the external terminals 19, 20 and 21 of the leadframe exposed. Since the leadframe has a number of semiconductor chip positions, the leadframe can be separated in the individual semiconductor module positions to form individual semiconductor modules 1 after the semiconductor modules 1 have been packaged in a plastic package 26.

To provide a leadframe, according to an embodiment, a metal plate, preferably a flat copper plate is patterned. Wet or dry etching methods or also stamping or cutting methods can be used for patterning the flat metal plate in this manner.

According to an embodiment, instead of a flat metal plate, a leadframe can also be produced by depositing a leadframe pattern galvanically on an auxiliary carrier and then removing the auxiliary carrier or taking the leadframe pattern off the auxiliary carrier, respectively.

According to an embodiment, a connecting bridge 43 is mounted as connecting element 22 between the third electrode 14 of the back 16 of the semiconductor chips 4 and 5, respectively, and the external contact blocks 23. Connecting elements 22 between the third electrode 14 on the back 16 of the semiconductor chips 4 and 5 respectively, and the external contact blocks 23 can also be applied by bonding of bonding wires or bonding strips.

According to an embodiment, the first and second electrodes 12 and 13 of the semiconductor chips 4 and 5, respectively, can be applied to the separated external terminals 19, 20 or 21 provided by soldering or bonding the electrodes 12 and 13 to corresponding contact terminal faces 54 of electrically separate ones of the external contact blocks 23.

After the components such as semiconductor chips 4 and 5, connecting elements 22 and external contact blocks 23 have been cast or embedded in a plastic package compound in the different semiconductor module positions of the leadframe, according to an embodiment, the latter can be separated into individual semiconductor modules 1 by means of a stamping or sawing method and it is also possible to use an etching method or a laser ablation method for separating the leadframe into individual semiconductor modules 1.

Figure 4:
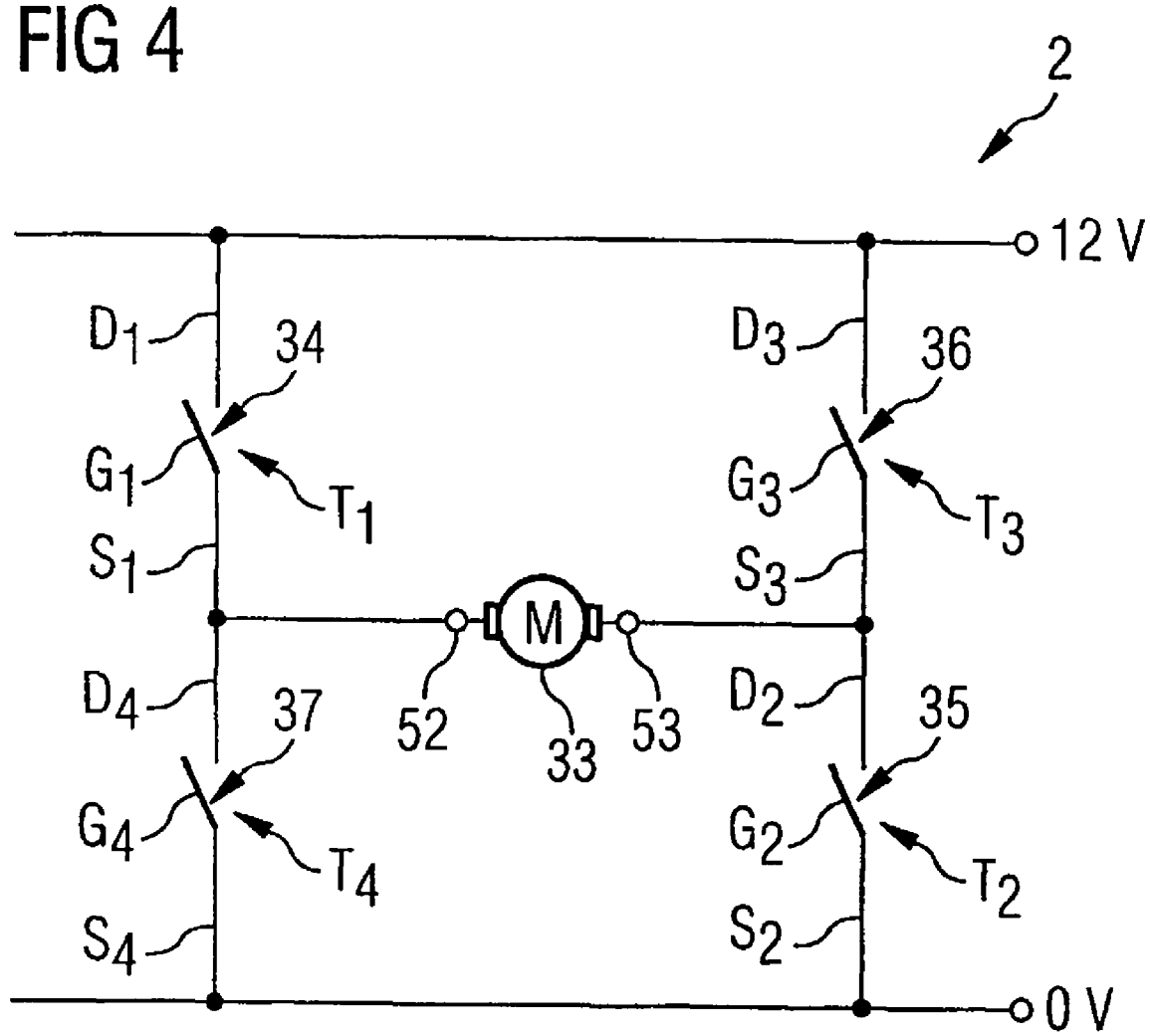
FIG. 4 shows a diagrammatic circuit of a semiconductor module of a further embodiment.

FIG. 4 shows a diagrammatic circuit of a semiconductor module 2 of a further embodiment. This embodiment contains an assembly variant according to an embodiment for a half bridge of an electric motor control, the supply lines, e.g. 0 V and 12 V, being drawn continuously and the other contacts in each case only being available on one package side. Such a semiconductor module is provided for on-board systems, wherein the motor 33 arranged between the motor terminals 52 and 53 is not a component of the semiconductor module. A bridge circuit according to FIG. 4 comprises four transistors 34 to 37 or $T_1$ to $T_4$, respectively. In this on-board system circuit for controlling a motor 33, the transistors $T_1$ and $T_4$ are connected in series between the O-V potential and the 12 V potential, the source electrode $S_4$ being connected to 0 V and the drain electrode $D_1$ to 12 V, and the source electrode $S_1$ and the drain electrode $D_4$ are connected together to the motor terminal 52. The second motor terminal 53 is connected to the drain electrode $D_2$ and the source electrode $S_3$ Of the transistors $T_2$ and $T_3$, the transistors $T_2$ and $T_3$ being connected in series between 0 and 12V.

Figure 5:
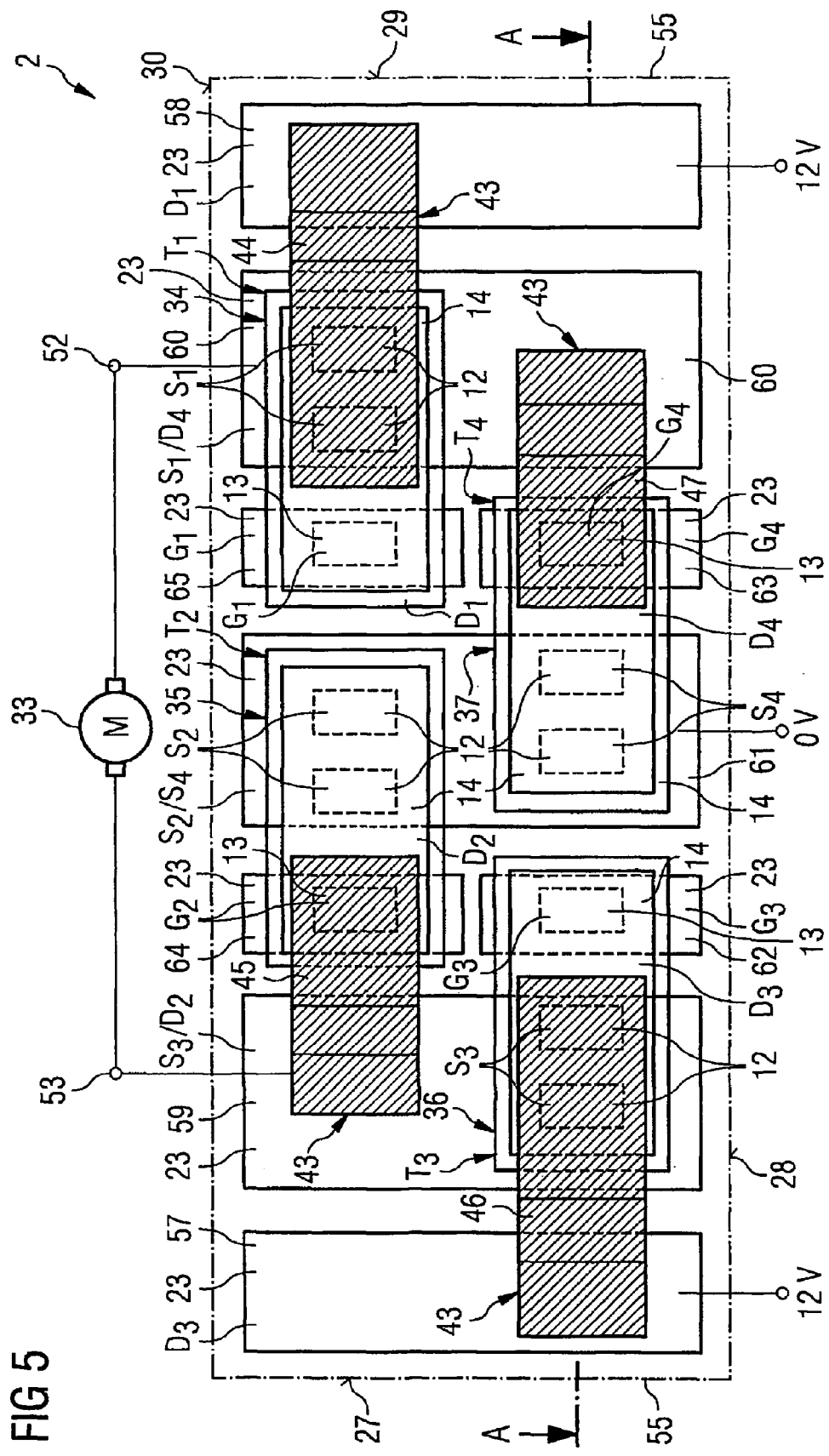
FIG. 5 shows a diagrammatic top view of a semiconductor module according to FIG. 4.

FIG. 5 shows a diagrammatic top view of an embodiment of a semiconductor module 2 according to the circuit in FIG. 4. Components having the same functions as in FIG. 2 are identified by the same reference symbols and are not explained separately. Here, too, the plastic package compound has been omitted, and only its contour is identified by a dot-dashed line 55, for illustrating the arrangement of semiconductor chips 4 to 7, connecting bridges 43 and external contact blocks 23. In this semiconductor module, too, care is taken to ensure that the number of connecting elements in the form of connecting bridges 43 is kept as small as possible.

According to an embodiment, only four connecting bridges 44 to 47 are used for interconnecting the 12 electrodes of the four semiconductor chips 4 to 7. These bridges connect the four semiconductor chips 4 to 7 to strip-shaped external contact blocks 57 to 65. The two external contact blocks 57 and 58 are provided for supplying the drain electrodes $D_1$ and $D_3$ with 12 V. Electrical connection to the semiconductor chips 4 and 6 of the transistors $T_1$ and $T_3$, respectively, is established by corresponding connecting bridges 44 and 46. A central external contact block 61, on which the source electrodes $S_2$ and $S_4$ of the transistors $T_2$ and $T_4$, respectively, are arranged via flip chip contacts, forms the connection for the ground potential and can be connected to 0 V.

According to an embodiment, next to the central external contact block 61, four separate external contact blocks 62 to 65 are arranged for the four gate electrodes $G_1$ to $G_4$ and can thus be driven isolated from one another. A further external contact block 60 connects the source electrode $S_1$ to the drain electrode $D_4$ whilst the external contact block 59 is connected to the source electrode $S_3$ and the drain electrode $D_2$ and forms the motor terminal 53. This half-bridge module for driving a motor 33 is characterized by a compact and inexpensively produced structure and makes use of the advantages of flip chip assembly of power semiconductor chips 4 to 7 on corresponding external contact blocks 59 to 65.

Figure 6:
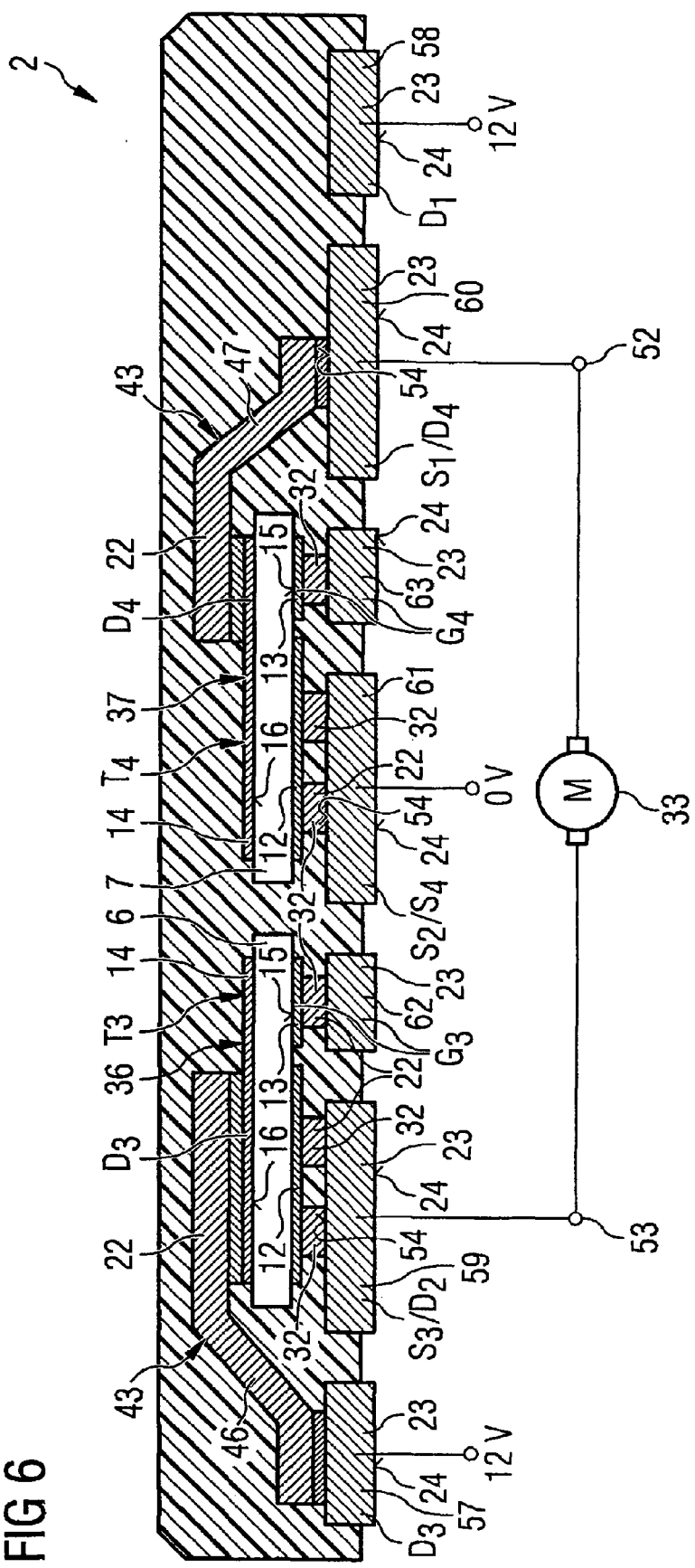
FIG. 6 shows a diagrammatic cross section through the semiconductor module according to FIG. 4.

FIG. 6 shows a diagrammatic cross section through an embodiment of the semiconductor module 2 according to FIG. 4 along the section plane A-A in FIG. 5. In this cross section, transistors $T_3$ and $T_4$ are shown with their semiconductor chips 6 and 7, respectively. The semiconductor chip 6 is connected to the external contact block 57, which is at 12 V, via the connecting bridge 46. The first electrode 12 on the first side 15 of the semiconductor chip 6 is connected via two contact pillars 32 of copper to the external contact block 59 which provides an electrical connection to the drain electrode $D_2$ at the same time.

According to an embodiment, the second electrode 13 is constructed as gate electrode $G_3$ and is electrically connected to the external contact block 62 via a copper pillar 32. This external contact block 62 can be driven isolated from the remaining external contact blocks. The fourth semiconductor chip 7, in turn, is connected with its source electrode 12 via two contact pillars 32, which are used as flip chip contacts, to the external contact block 61 which is at ground potential 0 V. The second electrode 13 of the semiconductor chip 7 is constructed as gate electrode $G_4$ and is electrically connected to the external contact block 63 isolated from the other external contact blocks.

Finally, the third contact 14 on the back 16 of the fourth semiconductor chip 7 is connected via a fourth connecting bridge 47 to a further external contact block 60 which, in cooperation with the source electrode $S_1$, forms the motor terminal 52, according to an embodiment. Between the motor terminal 52 and the motor terminal 53, a motor 33, which is not a component of the semiconductor module 2, can be driven.

According to an embodiment, n this sectional plane, the external contact block 58 does not have a connecting element but is connected to the drain electrode $D_1$ of the first transistor $T_1$ and is at 12-V potential according to FIG. 4. Such a circuit can be extended arbitrarily by joining together and extending the external contact blocks 57 to 61 and can also comprise more complex, for example full-bridge circuits.

Figure 7:
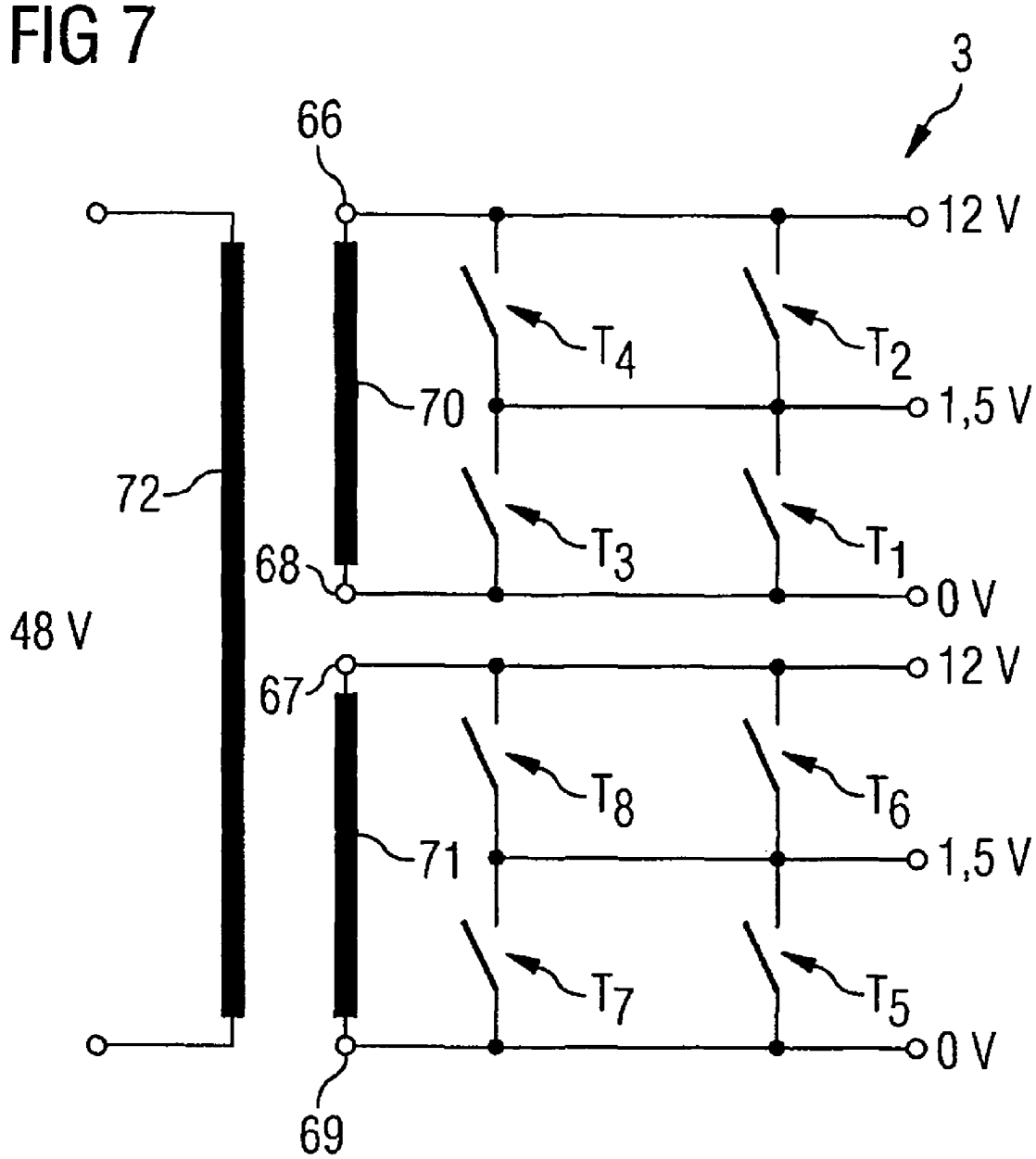
FIG. 7 shows a diagrammatic circuit of a semiconductor module according to a further embodiment.

FIG. 7 shows a diagrammatic circuit of a semiconductor module 3 according to a further embodiment. This semiconductor module 3 is a further exemplary application of an MCM component for a high-power DC/DC converter where in this case a number of chip contacts are connected in parallel to a contact element, for example a leadframe or a contact clip or connecting bridge which reduces the assembly structure and the assembly costs. The semiconductor module 3 is used for transforming a low direct voltage, for example, of 12 V to a higher direct voltage, for example of 48 V. For this purpose, a switching module is connected to a transformation element which accepts 12 V at its primary side and delivers 48 V at its secondary side. The rectifying area on the secondary side for 48 V direct voltage is not shown in detail. Only the circuit on the primary side is shown, this circuit supplying two transformer coils 70 and 71 at 12 V and for this purpose providing a circuit with eight transistors $T_1$ to $T_8$.

Figure 8:
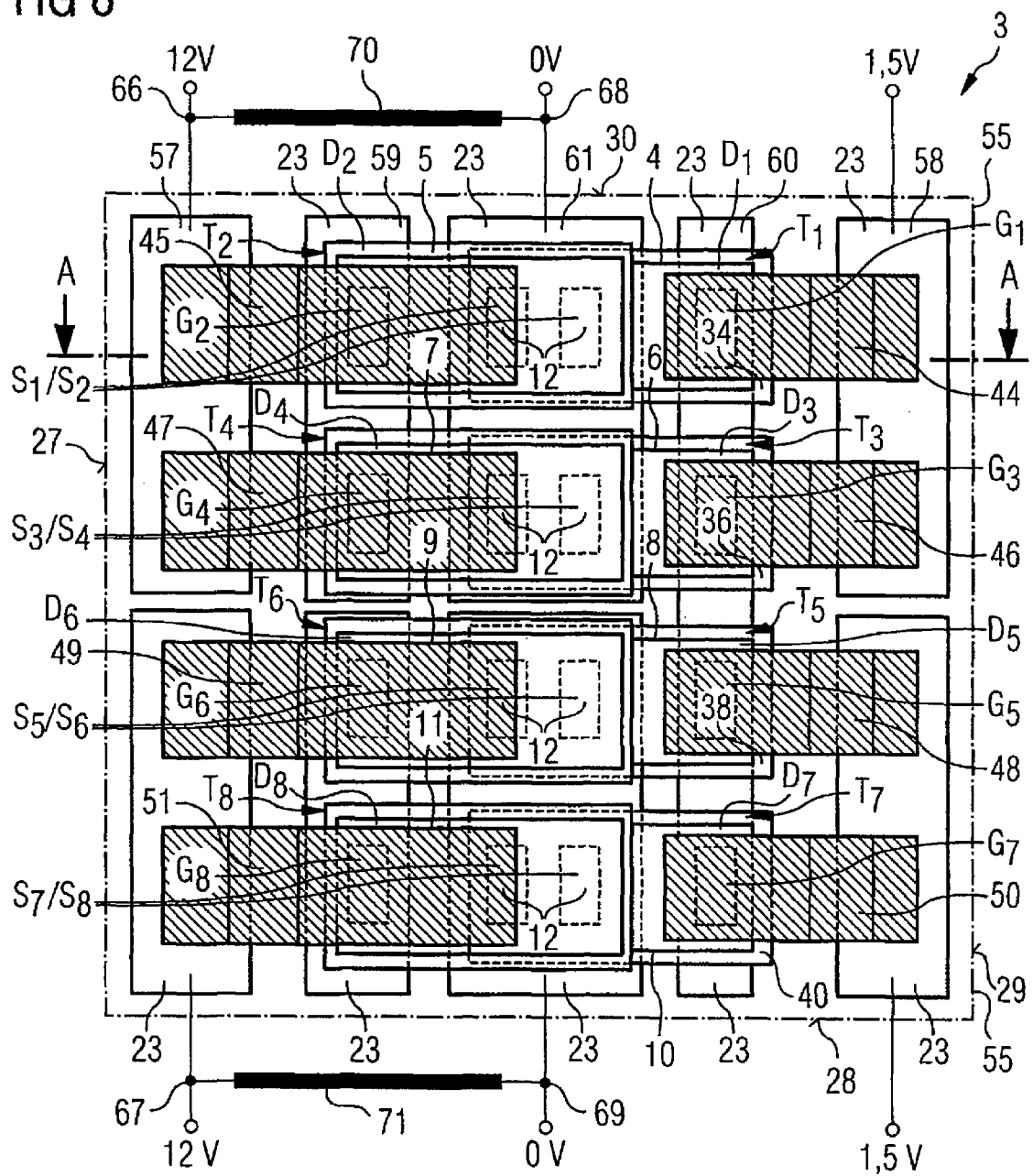
FIG. 8 shows a diagrammatic top view of the semiconductor module according to FIG. 7.

FIG. 8 shows a diagrammatic top view of an embodiment of the semiconductor module 3 according to FIG. 7. The plastic package compound has been omitted again and only the outer contour is marked by a dot-dashed line 55. Within the plastic package, strip-shaped external contact blocks 57 to 61 are provided on the underside of the semiconductor module 5, the external contact block 57 being interrupted in the center in order to enable the transformer coils 70 and 71 of the primary side to be supplied galvanically separately. The same applies to the central strip-shaped external contact block 61 which has the ground potential of 0 V and which can also be divided into two halves in order to provide a galvanically decoupled supply to the coil 70 with the transformer terminals 66 and 68 and the coil 71 with the transformer terminals 67 and 69.

Furthermore, according to an embodiment, an external contact block 59 is provided for the transistors $T_2$, $T_4$, $T_6$ and $T_8$ for driving the gate electrodes of these transistors $T_2$, $T_4$, $T_6$ and $T_8$. In addition, a further external contact block 60 is provided as control line for driving the gate electrodes of the transistors $T_1$, $T_3$, $T_5$ and $T_7$. A fifth external contact block 58, finally, supplies the circuit with a 1.5 V potential. The 24 electrodes of the eight transistors $T_1$ to $T_8$ only require eight connecting bridges 44 to 51 which are to be provided for the drain electrodes $D_1$ to $D_8$ on the backs 16 of the semiconductor chips.

According to an embodiment, the eight source electrodes $S_1$ to $S_8$ are stacked above one another in pairs so that only four source electrodes can be seen in the top view. This is achieved by firstly arranging a source electrode $S_1$ of a base transistor, for example $T_1$, on the external contact block 61 via flip chip contacts in the form of contact pillars 32 and the source electrode $S_2$ of a stacked semiconductor chip 5 being mechanically fixed and electrically connected on the third electrode 14 on the back 16 of the transistor $T_1$.

Figure 9:
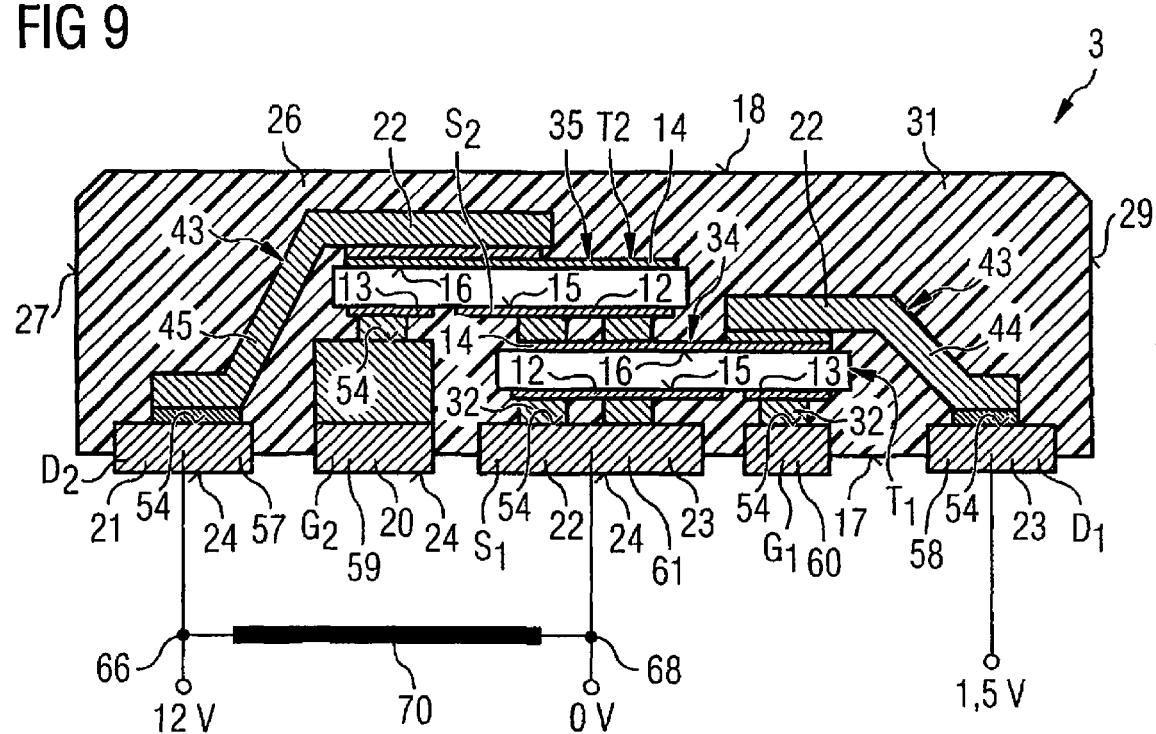
FIG. 9 shows a diagrammatic cross section through the semiconductor module according to FIG. 7.

Such a compact arrangement, according to an embodiment, with semiconductor chips 4 and 5, stacked in pairs, in flip chip arrangement is shown in detail in FIG. 9. Stacking the semiconductor chips 4 and 5 of the transistors $T_1$ and $T_2$ and the semiconductor chips 6 and 7 of transistors $T_3$ and $T_4$ and the semiconductor chips 8 and 9 of transistors $T_5$ and $T_6$, respectively, and the semiconductor chips 10 and 11 of transistors $T_7$ and $T_8$ distinctly reduces the space requirement and achieves a compact module in which transistors $T_1$, $T_3$, $T_5$ and $T_7$ form the base semiconductor chip with semiconductor chips 4, 6, 8 and 10, on the backs 16 of which in each case the semiconductor chips 5, 7, 9 and 11 of transistors $T_2$, $T_4$, $T_6$ and $T_8$ are stacked.

This also reduces the strip-shaped external contact blocks 23 to five external contact blocks 57 to 61, the external contact block 59 having a different height compared with the remaining external contact blocks 57, 58, 60 and 61 in order to equalize the thickness of the base semiconductor chip. This height can be achieved by resting on the external contact blocks constructed as leads as can be seen, for example, for the external contact block 59 in the cross section according to FIG. 9.

LIST OF REFERENCE DESIGNATIONS

1 Semiconductor module (embodiment)
2 Semiconductor module (further embodiment)
3 Semiconductor module (further embodiment)
4 First semiconductor chip
5 Second semiconductor chip
6 Third semiconductor chip
7 Fourth semiconductor chip
8 Fifth semiconductor chip
9 Sixth semiconductor chip
10 Seventh semiconductor chip
11 Eighth semiconductor chip
12 First electrode
13 Second electrode
14 Third electrode
15 First side of the semiconductor chip
16 Second side of the semiconductor chip
17 Second side of the semiconductor module
18 First side of the semiconductor module
19 External terminals (source)
20 External terminals (gate)
21 External terminals (drain)
22 Connecting element
23 External contact block
24 Surface-mountable external contact face
25 External contact face on peripheral sides
26 Semiconductor module package
27 Peripheral side of the semiconductor module
28 Peripheral side of the semiconductor module
29 Peripheral side of the semiconductor module
30 Peripheral side of the semiconductor module
31 Plastic package compound
32 Contact pillar
33 DC motor
34 First transistor
35 Second transistor
36 Third transistor
37 Fourth transistor
38 Fifth transistor
39 Sixth transistor
40 Seventh transistor
41 Eighth transistor
42 Semiconductor chip stack
43 Connecting bridge
44 First connecting bridge
45 Second connecting bridge
46 Third connecting bridge
47 Fourth connecting bridge
48 Fifth connecting bridge
49 Sixth connecting bridge
50 Seventh connecting bridge
51 Eight connecting bridge
52 Motor terminal
53 Motor terminal
54 Contact terminal face
55 Dot-dashed line
56 Solder layer $V_D$ supply potential
57 External contact block (12 V)
58 External contact block (12 V)
59 External contact block (M)
60 External contact block (M)
61 External contact block (0 V)
62 External contact block ($G_2$)
63 External contact block ($G_4$)
64 External contact block ($G_2$)
65 External contact block ($G_1$)
66 Transformer terminal
67 Transformer terminal
68 Transformer terminal
69 Transformer terminal
70 Transformer coil
71 Transformer coil
72 Transformer coil
$D_1$ to $D_8$ Drain electrode
E Emitter electrode
$G_1$ to $G_8$ Gate electrode
K Collector electrode
$S_1$ to $S_8$ Source electrode
$T_1$ to $T_8$ Transistors

What is claimed is:

1. A semiconductor module comprising:
at least two semiconductor chips each comprising
at least one first and one second electrode arranged on a first side of a respective semiconductor chip, and
at least one third electrode arranged on a second side of the respective semiconductor chip,
wherein the at least two semiconductor chips are arranged within the semiconductor module such that the electrodes on the first sides of the semiconductor chips are oriented toward a second side of the semiconductor module and the third electrodes on the second sides of the semiconductor chips are oriented toward a first side of the semiconductor module,
external contact blocks on the second side of the semiconductor module to which the electrodes of the first sides are coupled,
connecting elements which electrically couple the third electrodes to the external contact blocks, and
a plastic package compound in which the semiconductor chips, the connecting elements and the external contact blocks are embedded, leaving the external contact blocks exposed,
wherein the electrodes on the first side of the semiconductor chips have flip chip contacts arranged on the external contact blocks that are parallel to each other in a lengthwise direction and electrically separated from one another; and
wherein the two semiconductor chips are mounted adjacent to each other such that the first electrodes are mounted on, and electrically connected to, a same one of the external contact blocks, and the second electrodes are mounted on, and electrically connected to, two of the contact blocks that are different from each other and different from the external contact block connected to the first electrodes.

2. The semiconductor module according to claim 1, wherein the external contact blocks are freely accessible with surface-mountable external contact faces on the second side of the semiconductor module and are fixed in said plastic package.

3. The semiconductor module according to claim 1, wherein the external contact blocks have external contact faces on peripheral sides and on the second side of the semiconductor module.

4. The semiconductor module according to claim 1, wherein copper-containing pillars are arranged as flip-chip contacts having diffusion solder coating on the first and the second electrodes.

5. The semiconductor module according to claim 1, wherein the third electrode of each of the semiconductor chips is electrically connected to one of the external contact blocks via said connecting element which is a connecting bridge.

6. The semiconductor module according to claim 1, wherein the connecting elements comprise bonding strips.

7. The semiconductor module according to claim 1, wherein the external contact blocks of the semiconductor module are lead pieces of a leadframe.

8. The semiconductor module according to claim 1, wherein power semiconductor chips of a MOSFET or of an IGBT type are provided as semiconductor chips, and wherein the first electrode is a source or emitter electrode, respectively, and the third electrode is a drain or collector electrode, respectively.

9. The semiconductor module according to claim 1, wherein the semiconductor module is provided for an on-board system.

10. The semiconductor module according to claim 1, wherein the semiconductor module has a bridge circuit for a motor control.

11. The semiconductor module according to claim 1, wherein the semiconductor module is an AC/DC converter.

12. The semiconductor module according to claim 1, wherein the semiconductor module is a DC/DC converter.

13. A semiconductor module, comprising:
a first semiconductor chip and a second semiconductor chip, each comprising:
a first electrode and a second electrode each arranged on a first side of the respective semiconductor chip, and
a third electrode arranged on an opposing second side of the respective semiconductor chip, and
wherein the first and second semiconductor chips are arranged within the semiconductor module such that the first electrodes and the second electrodes are oriented toward a second side of the semiconductor module and the third electrodes are oriented toward an opposing first side of the semiconductor module;
first, second and third external contact blocks external to the second side of the semiconductor module, wherein the first electrodes of the first and second semiconductor chips are electrically coupled to and arranged on the first external contact block, the second electrode of the first semiconductor chip is electrically coupled and arranged on the second external contact block, the second electrode of the second semiconductor chip is electrically coupled to and arranged on the third external contact block, the third electrode of the second semiconductor chip is electrically coupled to the second external contact block, and the third electrode of the first semiconductor chip is electrically coupled to the third external contact block; and
a plastic package compound in which the semiconductor chips and the first, second, and third external terminals are embedded, leaving the first, second, and third external terminals exposed,
wherein the electrodes on the first side of the semiconductor chips have flip chip contacts arranged on the external contact blocks that are parallel to each other in a lengthwise direction and electrically separated from one another; and
wherein the two semiconductor chips are mounted adjacent to each other such that the first electrodes are mounted on, and electrically connected to, a same one of the contact blocks, and the second electrodes are mounted on, and electrically connected to, two of the contact blocks that are different from each other and from the contact block connected to the first electrodes.

14. A semiconductor module, comprising:
two semiconductor chips, each of the two semiconductor chips comprising:
a first electrode and a second electrode each arranged on a first side of the respective semiconductor chip, and
a third electrode arranged on an opposing second side of the respective semiconductor chip,
wherein the two semiconductor chips are arranged within the semiconductor module such that the first electrodes and the second electrodes are oriented toward a second side of the semiconductor module and the third electrodes are oriented toward an opposing first side of the semiconductor module;
a plurality of contact blocks external to the second side of the semiconductor module, wherein the first, second, and third electrodes are each electrically coupled to at least one of the plurality of contact blocks, and wherein the first electrodes and the second electrodes are each arranged on the at least one of the plurality of contact blocks to which they respectively are electrically coupled, and
a plastic package compound in which the semiconductor chips and the external contact blocks are embedded, leaving the external contact blocks exposed,
wherein the electrodes on the first side of the semiconductor chips have flip chip contacts arranged on the external contact blocks that are parallel to each other in a lengthwise direction and electrically separated from one another; and
wherein the two semiconductor chips are mounted adjacent to each other such that the first electrodes are mounted on, and electrically connected to, a same one of the contact blocks, and the second electrodes are mounted on, and electrically connected to, two of the contact blocks that are different from each other and from the contact block connected to the first electrodes.

15. A semiconductor module, comprising:
a first semiconductor chip and a second semiconductor chip, each of the semiconductor chips comprising:
a first electrode and a second electrode each arranged on a first side of the respective semiconductor chip, and
a third electrode arranged on an opposing second side of the respective semiconductor chip,
wherein the first and second semiconductor chips are arranged within the semiconductor module such that the first electrodes and the second electrodes are oriented toward a second side of the semiconductor module and the third electrodes are oriented toward an opposing first side of the semiconductor module;
first, second and third contact blocks external to the second side of the semiconductor module; and
connecting elements for electrically coupling the electrodes to the external contact blocks the electrodes to the external terminals,
wherein the second electrode of the first semiconductor chip is electrically coupled to and arranged on the first external contact block and the third electrode of the second semiconductor chip is electrically coupled to the first external contact block via a connecting element, and
wherein the second electrode of the second semiconductor chip is electrically coupled to and arranged on the second external contact block and the third electrode of the first semiconductor chip is electrically coupled to the second external contact block via a connecting element, and wherein the first electrodes are electrically coupled to and arranged on the third external contact block, the semiconductor module further comprising a plastic package compound in which the semiconductor chips, the connecting elements, and the first, second, and third external contact blocks are embedded, leaving the first, second, and third external contact blocks exposed, wherein the electrodes on the first side of the semiconductor chips have flip chip contacts arranged on external contact blocks that are parallel to each other in a lengthwise direction and electrically separated from one another; and wherein the two semiconductor chips are mounted adjacent to each other such that the first electrodes are mounted on, and electrically connected to, a same one of the contact blocks, and the second electrodes are mounted on, and electrically connected to, two of the contact blocks that are different from each other and from the contact block connected to the first electrodes.

* * * * *

UNITED STATES PATENT AND TRADEMARK OFFICE
CERTIFICATE OF CORRECTION

PATENT NO. : 7,880,288 B2  
APPLICATION NO. : 11/692020  
DATED : February 1, 2011  
INVENTOR(S) : Ralf Otremba Page 1 of 1

It is certified that error appears in the above-identified patent and that said Letters Patent is hereby corrected as shown below:

Column 12, Claim 15, Lines 58-59:
Please delete "the electrodes to the external terminals"

Signed and Sealed this
Twentieth Day of December, 2011

David J. Kappos
*Director of the United States Patent and Trademark Office*